US008391605B2

(12) United States Patent
Hsu et al.

(10) Patent No.: US 8,391,605 B2
(45) Date of Patent: *Mar. 5, 2013

(54) METHOD AND APPARATUS FOR PERFORMING MODEL-BASED OPC FOR PATTERN DECOMPOSED FEATURES

(75) Inventors: Duan-Fu Stephen Hsu, Fremont, CA (US); Jung Chul Park, Pleasanton, CA (US); Douglas Van Den Broeke, Sunnyvale, CA (US); Jang Fung Chen, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/358,497

(22) Filed: Jan. 25, 2012

(65) Prior Publication Data

US 2012/0122023 A1    May 17, 2012

Related U.S. Application Data

(63) Continuation of application No. 11/898,646, filed on Sep. 13, 2007, now Pat. No. 8,111,921.

(60) Provisional application No. 60/844,074, filed on Sep. 13, 2006.

(51) Int. Cl.
  *G06K 9/00*   (2006.01)
  *G06F 17/50*  (2006.01)

(52) U.S. Cl. .............................. 382/181; 716/53; 716/55

(58) Field of Classification Search .................. 382/159, 382/165, 170, 181, 194, 309; 700/135; 703/14; 706/20, 48; 716/52, 53, 55, 106; 725/19
See application file for complete search history.

(56) References Cited

U.S. PATENT DOCUMENTS

| 5,969,441 | A | 10/1999 | Loopstra et al. |
| 6,046,792 | A | 4/2000 | Van Der Werf et al. |
| 6,430,737 | B1 | 8/2002 | Cobb et al. |
| 6,851,103 | B2 | 2/2005 | Van Den Broeke et al. |
| 7,028,284 | B2 | 4/2006 | Cobb et al. |
| 7,278,125 | B2 * | 10/2007 | Nojima .......................... 716/55 |
| 7,367,009 | B2 * | 4/2008 | Cobb et al. ..................... 716/53 |

(Continued)

FOREIGN PATENT DOCUMENTS

| EP | 1 447 711 | 8/2004 |
| JP | 2004-079586 | 11/2004 |

(Continued)

OTHER PUBLICATIONS

Search Report issued May 15, 2008 in corresponding Singapore application.

(Continued)

*Primary Examiner* — Abolfazl Tabatabai
(74) *Attorney, Agent, or Firm* — Pillsbury Winthrop Shaw Pittman LLP

(57) ABSTRACT

A method for decomposing a target circuit pattern containing features to be imaged into multiple patterns. The process includes the steps of separating the features to be printed into a first pattern and a second pattern; performing a first optical proximity correction process on the first pattern and the second pattern; determining an imaging performance of the first pattern and the second pattern; determining a first error between the first pattern and the imaging performance of the first pattern, and a second error between the second pattern and the imaging performance of said second pattern; utilizing the first error to adjust the first pattern to generate a modified first pattern; utilizing the second error to adjust the second pattern to generate a modified second pattern; and applying a second optical proximity correction process to the modified first pattern and the modified second pattern.

22 Claims, 8 Drawing Sheets

DEL CLN imaging

. After double exposures the average intensity modulation is flat
. The final print image is the 'OR' of each exposure
. Needs materials/processing to preserve the images for each exposure

U.S. PATENT DOCUMENTS

| | | | |
|---|---|---|---|
| 7,546,178 B2 | 6/2009 | Kouno et al. | |
| 7,604,907 B2 * | 10/2009 | Lee et al. | 430/5 |
| 7,638,244 B2 * | 12/2009 | Kanai | 430/5 |
| 2005/0008952 A1 | 1/2005 | Dulman et al. | |
| 2006/0008135 A1 | 1/2006 | Nojima | |
| 2006/0088772 A1 | 4/2006 | Zhang | |
| 2006/0101370 A1 | 5/2006 | Cui et al. | |
| 2007/0248899 A1 | 10/2007 | Choi et al. | |

FOREIGN PATENT DOCUMENTS

| | | |
|---|---|---|
| JP | 2005-227666 | 8/2005 |
| JP | 2006-023649 | 1/2006 |
| JP | 2006-106757 | 4/2006 |
| JP | 2007-279759 | 10/2007 |

OTHER PUBLICATIONS

European Search Report dated Nov. 18, 2011 in corresponding European Patent Application No. 07253652.7.

Jungchul Park et al., "Application Challenges with Double Patterning Technology (DPT) beyond 45 nm," Proc. of SPIE, vol. 6349, pp. 634922-1-634922-12 (2006).

Martin Drapeau et al., "Double Patterning Design Split Implementation and Validation for the 32nm Node," Proc. of SPIE, vol. 6521, pp. 652109-1-652109-15 (2007).

JW Park et al., "Robust Double Exposure Flow for Memory," Proc. of SPIE, vol. 6154, pp. 61542E-1-61542E-10 (2006).

Chang-Moon Lim et al., "Positive and Negative Tone Double Patterning Lithography for 50nm Flash Memory," Proc. of SPIE, vol. 6154, pp. 615410-1-615410-8 (2006).

Stephen Hsu et al., "65nm Full-chip Implementation Using Double Dipole Lithography," Proc. of SPIE, vol. 5040, pp. 215-231 (2003).

Japanese Office Action dated Sep. 20, 2011 in corresponding Japanese Patent Application No. 2002-234053.

Taiwan Office Action dated Jan. 30, 2012 in corresponding Taiwan Patent Application No. 096134260.

European Office Action dated Oct. 16, 2012 in corresponding European Patent Application No. 07 253 652.7.

* cited by examiner

DEL CLN imaging

. After double exposures the average intensity modulation is flat
. The final print image is the 'OR' of each exposure
. Needs materials/processing to preserve the images for each exposure

Pattern split impact on patterning

METHOD AND APPARATUS FOR PERFORMING MODEL-BASED OPC FOR PATTERN DECOMPOSED FEATURES

RELATED APPLICATIONS

This application is a continuation of U.S. application Ser. No. 11/898,646, filed Sep. 13, 2007, issuing on Feb. 7, 2012 as U.S. Pat. No. 8,111,921, which claims priority from U.S. Provisional Application No. 60/844,074, filed on Sep. 13, 2006, the contents of which are incorporated herein by reference in their entirety.

FIELD OF THE INVENTION

This disclosure relates generally to performing optical proximity (OPC) correction to a mask design, and more particularly, it relates to a method of performing OPC to a mask design which has been decomposed into multiple patterns, and which will be imaged utilizing a multiple exposure process (also referred to as double-patterning (DPT)).

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). One technique, which is currently receiving attention is double-patterning or DPT. Generally speaking, double patterning is an exposure method that involves splitting (i.e., dividing or separating) a dense circuit pattern into two separate, less-dense patterns. The simplified patterns are then printed separately on a target wafer utilizing two separate masks (where one of the masks is utilized to image one of the less-dense patterns, and the other mask is utilized to image the other less-dense patterns). Further, the second pattern is printed in between the lines of the first pattern such that the imaged wafer has, for example, a feature pitch which is half that found on either of the two masks. This technique effectively lowers the complexity of the lithography process, improving the achievable resolution and enabling the printing of far smaller features than would otherwise be possible.

However, while it possible to determine how to separate a target pattern into two separate masks, as explained further below, standard OPC treatments of the respective masks is often insufficient to obtain acceptable imaging performance. This is due in part to the stronger proximity effects that occur when imaging features having increasingly smaller CDs, such as for example, in the 32 nm mode. Indeed, standard OPC treatments to the individual masks will often result in the final imaged pattern exhibiting broken contours or line breaks.

Accordingly, it is an object of the present invention to provide a method and apparatus for applying OPC to a mask design which has been decomposed into multiple patterns/masks in a double-patterning process, which overcomes the aforementioned problems.

SUMMARY

In view of the foregoing it is an object of the present invention to provide an improved process for performing decomposition of a target pattern to be utilized in a double-patterning process, which provides for improved imaging results.

More specifically, the present invention relates to a method for decomposing a target circuit pattern containing features to be imaged into multiple patterns. The process includes the steps of separating the features to be printed into a first pattern and a second pattern; performing a first optical proximity correction process on the first pattern and the second pattern; determining an imaging performance of the first pattern and the second pattern; determining a first error between the first pattern and the imaging performance of the first pattern, and a second error between the second pattern and the imaging performance of said second pattern; utilizing the first error to adjust the first pattern to generate a modified first pattern; utilizing the second error to adjust the second pattern to generate a modified second pattern; and applying a second optical proximity correction process to the modified first pattern and the modified second pattern.

The process of present invention allows for the decomposition of a given target pattern into multiple patterns, which when imaged in a multiple illumination process, such as double-patterning, accurately reproduce the desired target pattern within acceptable error criteria. Importantly, the foregoing process eliminates the broken lines and disconnects occurring in the stitching areas between the decomposed patterns.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively.

The invention itself, together with further objects and advantages, can be better understood by reference to the following detailed description and the accompanying drawings.

DETAILED DESCRIPTION

This disclosure illustrates a method of applying OPC treatments to mask patterns resulting from the decomposition of a target pattern into the multiple mask patterns for use in a double-patterning process. Prior to discussing the OPC process of the present invention, a brief overview of the decomposition process is provided.

Figure 1:
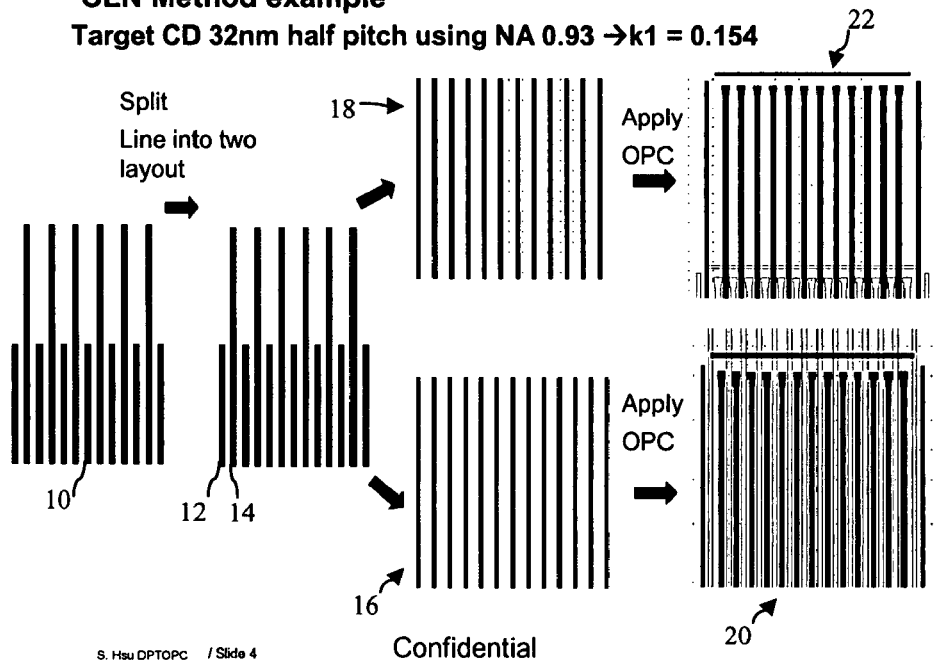
FIGS. 1 and 2 illustrate an example of a pattern decomposition process.
Figure 2:
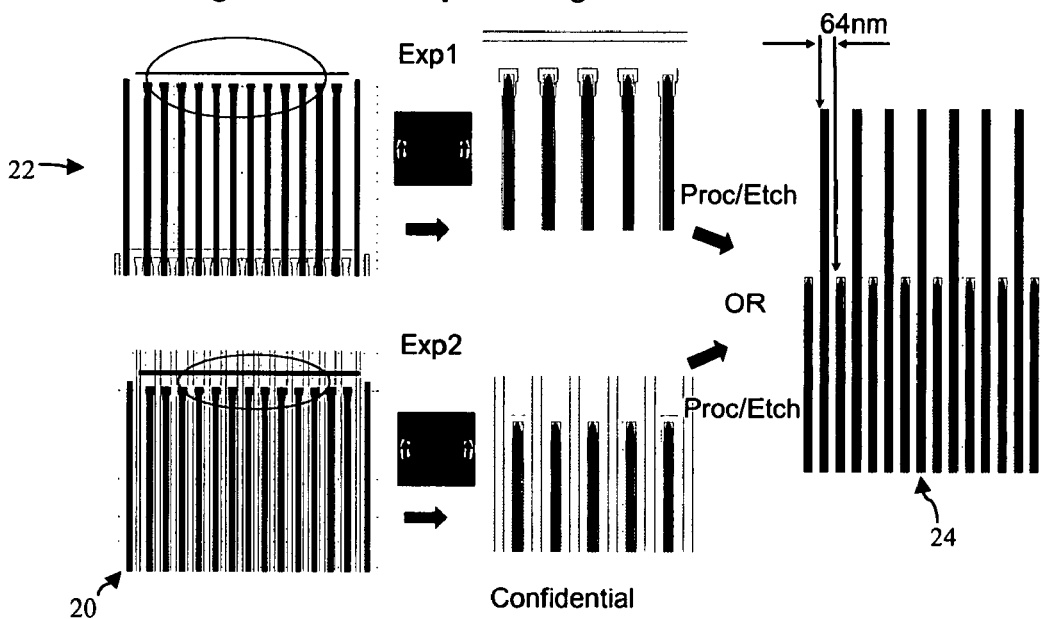
Figure 3:
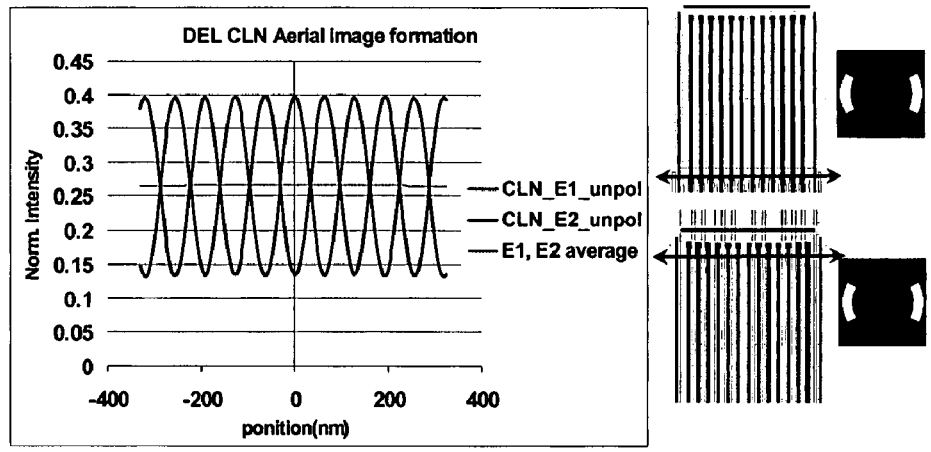
FIG. 3 is a graph of the average image intensity of the resulting image of the double exposure process shown in FIGS. 1 and 2.

Various techniques are known for separating (also referred to as coloring) the target pattern into two separate patterns, which are then utilized as the basis to generate two separate masks. One such method is referred to as the coloring line method (CLN). FIGS. 1-3 illustrate an exemplary process of the coloring line method. Referring to FIG. 1, a target pattern 10 is first colored, for example, based on pitch to identify which features will be assigned to the separate masks. In the given example, the short features 12 are assigned to a first mask 16 and the long features 14 are assigned to a second mask 18. As shown, the resulting pitch between features in the resulting masks is twice the pitch between the features in the original target mask, which thereby allows for proper imaging of the features. After the target pattern is decomposed into separate masks/patterns, OPC can be applied to the individual masks 20, 22 as shown in FIG. 1.

Once the OPC treatment is applied, the wafer is subjected to two exposures, first utilizing the first mask 20 and then utilizing the second mask 22 (however, the order of exposure may also be reversed) and then etched so as to generate the desired pattern in the wafer as shown in FIG. 2 (see, reference numeral 24). The resulting image represents an "OR" combination of the first and second exposure processes. Referring to FIG. 3, it is noted that after the double exposure process the average intensity modulation is substantially flat.

Figure 4:
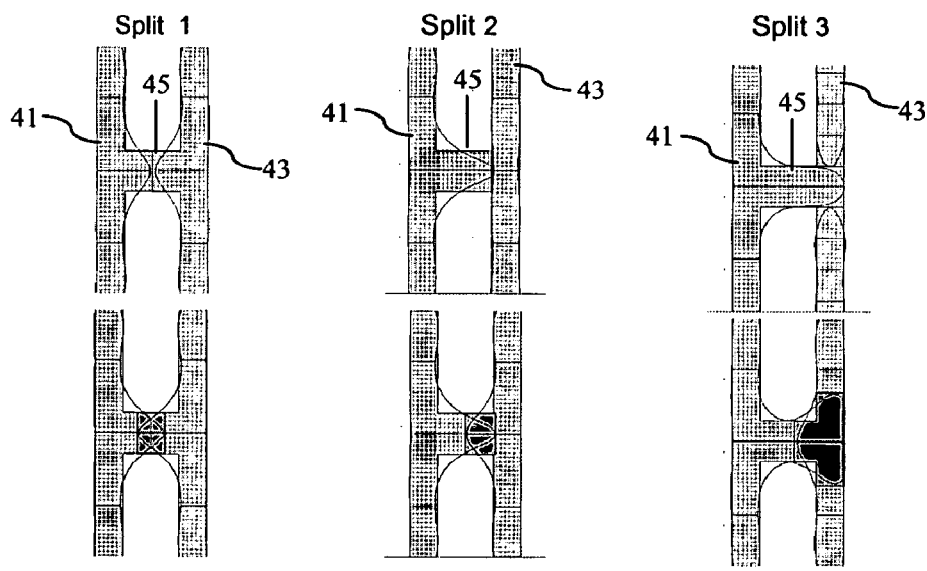
FIG. 4 illustrates examples regarding how a given pattern feature can be split into separate features.

It is further noted that there are various methods and techniques for decomposing or splitting a target pattern into multiple patterns. First, there are both rule-based and model-based techniques for performing the decomposition process. Second, there are also numerous options for performing the decomposition process for a given pattern. FIG. 4 illustrates a number of different examples regarding the decomposition of the same pattern. Referring to FIG. 4, "Split 1" illustrates the H-shaped feature having horizontal lines 41, 43 being decomposed in the center of the vertical line 45. "Split 2" illustrates the H-shaped feature being decomposed at the point the vertical line 45 contacts the inner edge of horizontal line 43. "Split 3" illustrates the H-shaped feature being decomposed at the point the vertical line 43 contacts the outer edge of horizontal line 43.

Figure 5:
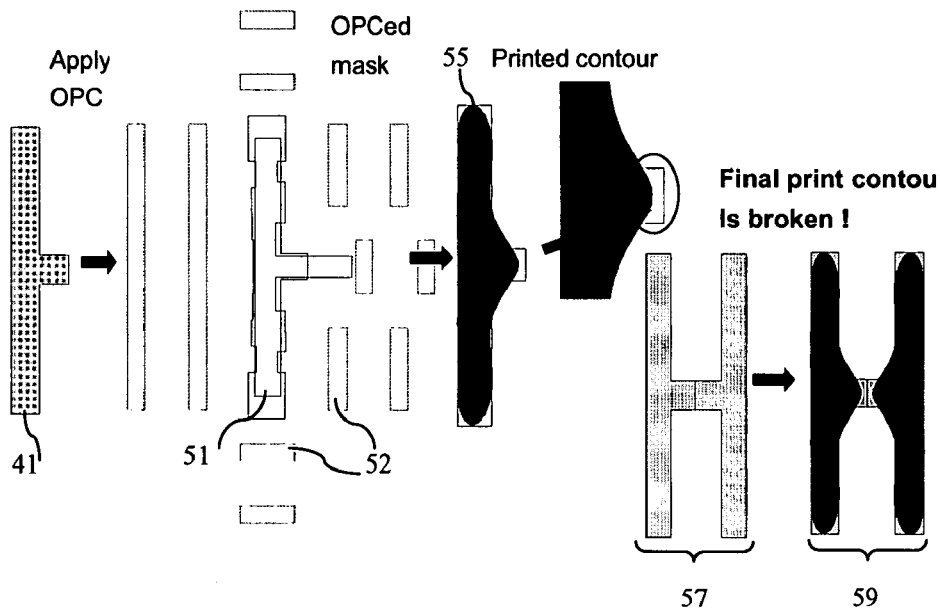
FIG. 5 illustrates the application of OPC techniques to the decomposed pattern example shown in "Split 1" of FIG. 4.

Once the target pattern is separated into two or more patterns, OPC techniques can be applied to the individual patterns. However, current processes apply the OPC treatment directly to the decomposed patterns. FIG. 5 illustrates the application of OPC techniques to the decomposed pattern example shown in "Split 1" of FIG. 4. As shown, the decomposed feature, corresponding to decomposed feature 41, is subjected to an OPC treatment (see, reference numeral 51). It is noted that the shape of feature 41 is modified during the OPC treatment. In addition, the OPC treatment may include the addition of assist features 52 (or scatter bar features) to the mask pattern. Next, the OPC treated pattern 51 is utilized to generate a mask, which is illuminated (or simulated) to determine the printed contour resulting from the OPC treated feature 51.

Continuing with the foregoing example, the resulting printed contour 55 is illustrated in FIG. 5. As shown, although the feature was treated with OPC prior to imaging, the resulting printed contour corresponding to the feature exhibits a shortened interconnect section. The opposing feature 43 disposed in a separate mask pattern, which has also been treated with OPC, also exhibits a shortened interconnect section. As a result, the combined result of the multiple imaging process produces a final contour 59 which exhibits an undesirable line break as shown in FIG. 5, and therefore does not produce the desired contour 57. It is noted that this problem becomes more significant at the 32 nm mode due to the stronger optical proximity effects associated with smaller critical dimension requirements at this mode of operation. The process of the present invention eliminates the foregoing issues.

Figure 6:
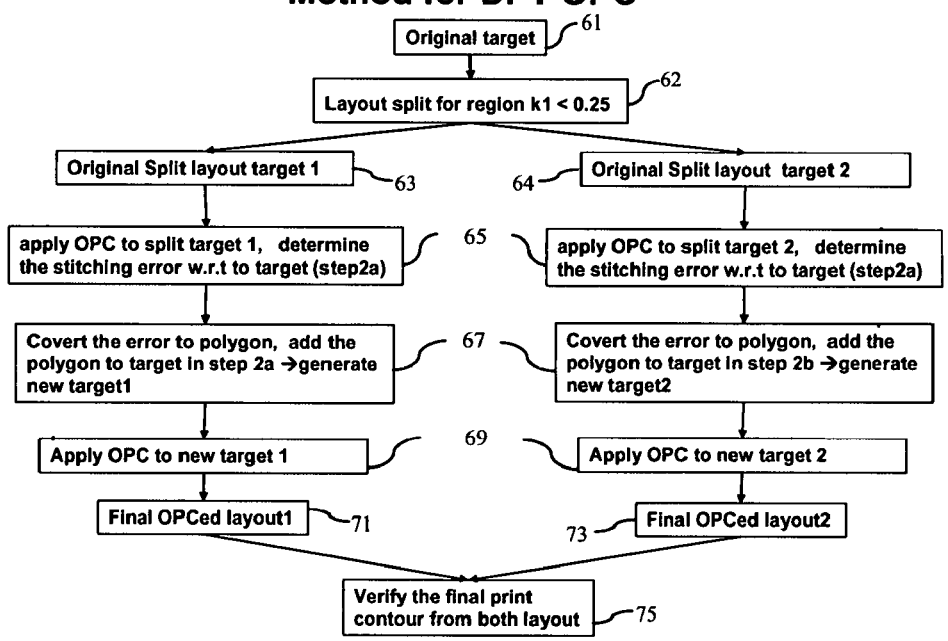
FIG. 6 illustrates an exemplary flowchart illustrating the process of decomposing a target pattern into multiple patterns and applying OPC treatments to the decomposed patterns in accordance with the present invention.

FIG. 6 illustrates an exemplary flowchart illustrating the process of decomposing a target pattern into multiple patterns and applying OPC treatments to the decomposed patterns in accordance with the present invention. Referring to FIG. 6, the first step (Step 61) in the process is to define the original target (also referred to as the target pattern). The target pattern is then decomposed (Step 62) into multiple patterns (63, 64) utilizing any suitable rule-based or model-based technique for decomposing patterns. It is noted that typically the decomposition process focuses on the densely spaced features in the given target pattern as the non-critical features can be placed in either mask pattern. The next step (Step 65) is to apply an OPC treatment to each of the decomposed patterns and to determine the error of the resulting contour of the decomposed patterns with respect to the target pattern in the stitching areas (i.e., the areas in which features in the target pattern contact one another, but which are separated from one another in the decomposed patterns, such as the vertical feature 45 as shown in FIG. 4). The error determination is accomplished, for example, by simulating the imaging performance of each decomposed pattern and then comparing the simulation result to the decomposed pattern to determine the difference or error between the simulated and desired decomposed contour. It is noted that any suitable OPC treatment such as a rule-based or model-based OPC treatment may be utilized to apply OPC to the decomposed patterns. In addition, any suitable simulation program may be utilized to determined the imaging performance of the decomposed patterns treated with OPC.

In the next step (Step 67), the error in each of the stitching areas is utilized as a basis to adjust the original decomposed patterns to generate new decomposed patterns, which become the desired target patterns. More specifically, the amount of error (e.g., the amount of feature shortening exhibited) is added to the original decomposed pattern in the corresponding stitching area so as to form the new decomposed pattern. This can be accomplished, for example, by approximating the size of the error area utilizing a correspondingly sized polygon, and then adding the polygon representing the error to the original decomposed patterns in the appropriate area of the design. As noted, these newly formed patterns become the target design for the decomposed patterns.

Next, the newly formed decomposed patterns are subjected to an OPC treatment (Step 69). As in Step 65, any suitable OPC treatment can be utilized to apply the OPC treatment in Step 69. It is preferable that the same OPC be utilized in both Step 65 and Step 69. Once the OPC treatment is applied to the newly formed decomposed patterns, the resulting patterns (71 and 73) represent the final patterns to be utilized in the multi-illumination process. In an optional step (Step 75), it is noted that the patterns generated as a result of Step 69 can be subjected to a verification process that simulates the imaging performance of the two masks so as to confirm the image resulting from the combined exposures of both masks produces the desired target pattern within an acceptable error tolerance. This verification process can also be performed via a suitable simulation process.

Figure 7:
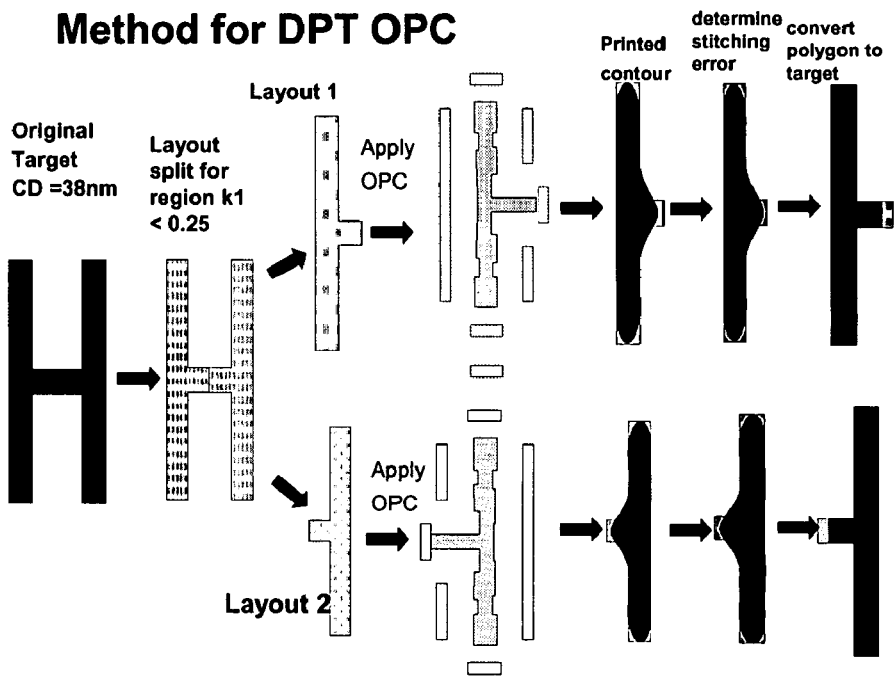
FIGS. 7-11 illustrate examples of the process set forth in the flowchart of FIG. 6.
Figure 8:
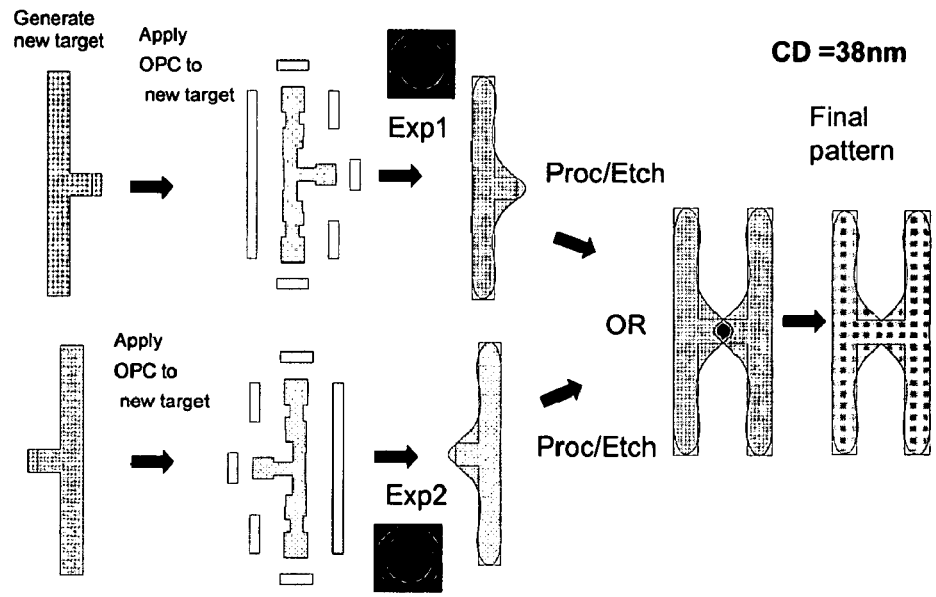

FIGS. 7 and 8 provide an illustration of the foregoing process. Referring first to FIG. 7, starting with the original pattern or target pattern, which is an H-shaped feature, this layout is split into two features, with the stitching area being in the center of the vertical connection feature. Layout 1 and layout 2 as shown in FIG. 7 represent the original decomposed patterns. Next, an OPC treatment is applied to layout 1 and layout 2, and then a simulation process is executed to generate the expected printed contour for each of layout 1 and layout 2. Thereafter, the resulting printed/simulated contour is compared to the original decomposed patterns to determine the error between the printed/simulated contour and the original decomposed pattern in the stitching area. It is noted that the error determination can be based on, but not limited to, a 1-dimensional comparison between the original decomposed patterns and the printed/simulated contours or a 2-dimensional comparison. The error in each stitching area is then converted to a polygon which represents the amount or value of the error, and the given polygon corresponding to each stitching area is added to the original decomposed patterns in the corresponding stitching area so as to generate new decomposed patterns, which become the target design. Of course, other methods of determining the imaging error and the corresponding adjustment of the original decomposed patterns are also possible.

Then, referring to FIG. 8, starting with the newly generated decomposed patterns, these patterns are subject to an OPC treatment, preferably, the same OPC process as performed to the original decomposed features. The patterns resulting from this OPC process represent the patterns to be utilized in the double patterning process. These patterns are then utilized to image a wafer in a multiple illumination process so as to generate the original H-shaped target feature. As shown in FIG. 8, the resulting imaged pattern does not have any broken contours, and the H-shaped pattern is accurately reproduced. It is also noted that if the optional verification step is performed before actual imaging, the OPCed patterns shown in FIG. 8 can be subjected to a simulation process to determine if the resulting imaged wafer would produce the desired results.

Figure 9:
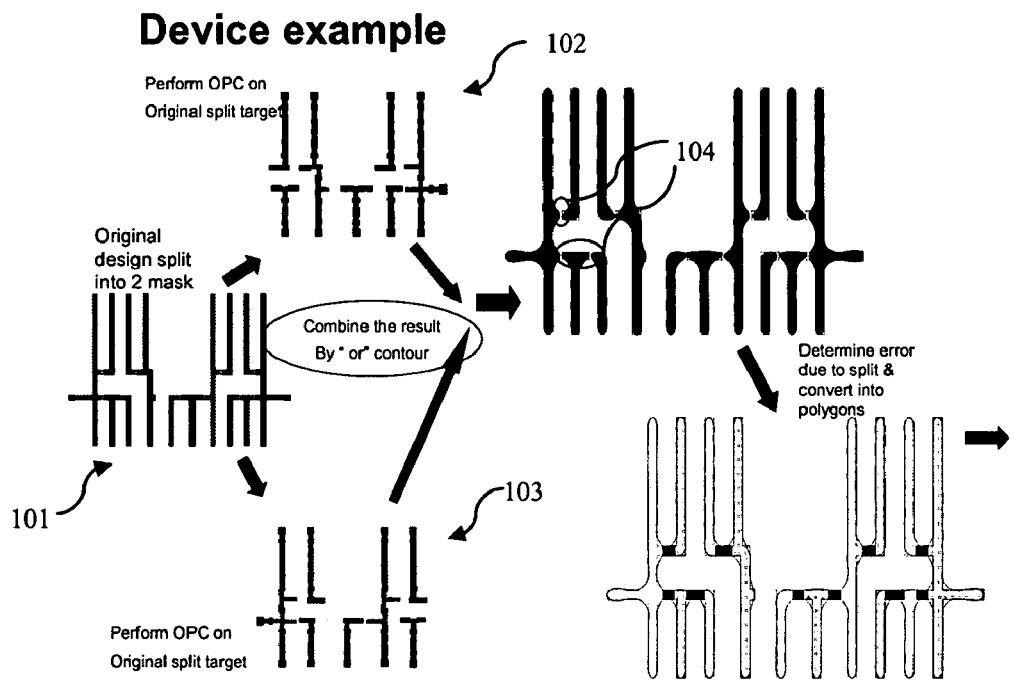
Figure 10:
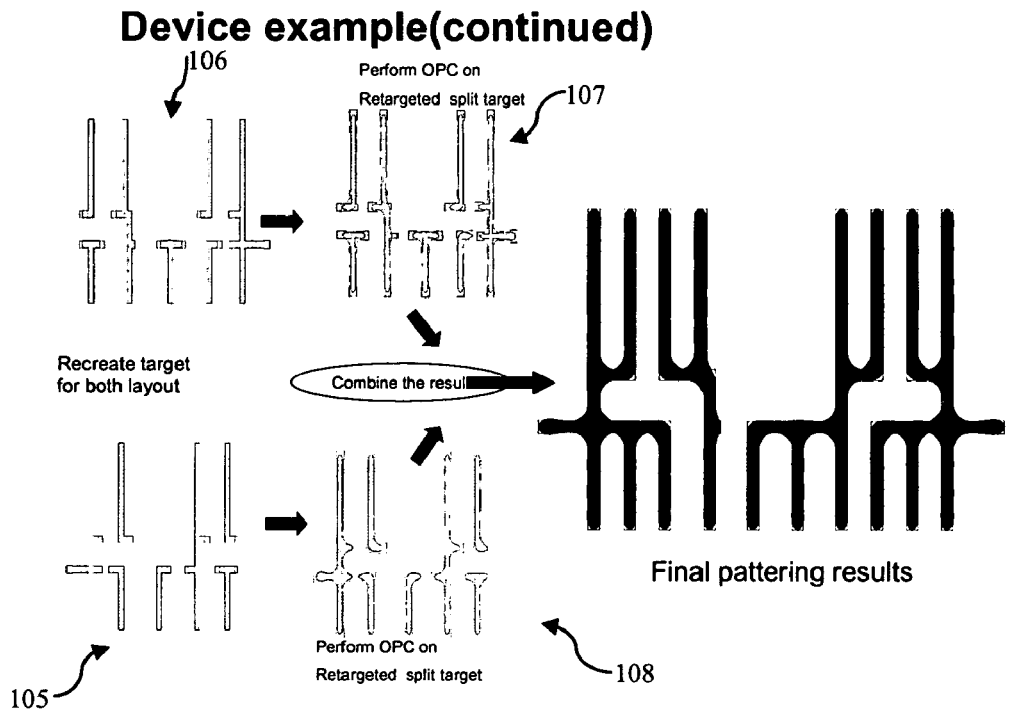
Figure 11:
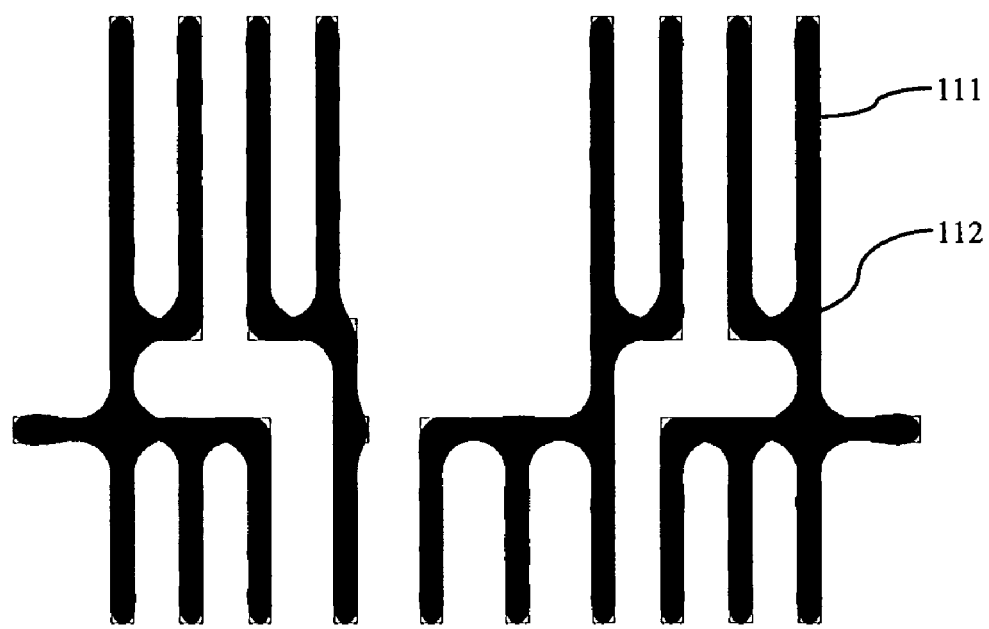

FIGS. 9 and 10 illustrate another example of applying the process of the present invention to a target pattern to be imaged. Referring to FIG. 10, the target pattern 101 is decomposed into two separate patterns and subjected to an OPC treatment (see, patterns 102 and 103). The image resulting from the sequential exposure of patterns 102 and 103 is simulated to determine the resulting error between the target pattern and the simulated pattern in the stitching area (see, e.g., areas 104 in FIG. 9). The amount of this error is determined and then utilized to extend the features in the stitching area by the amount of the error so as to generate new decomposed patterns 105 and 106. Patterns 105 and 106 are then subjected to an OPC treatment (see, patterns 107 and 108), and thereafter utilized to image the target feature in the actual imaging process. The final patterning results are also illustrated in FIG. 10. Finally, FIG. 11 illustrates a comparison between imaging results from a prior art imaging process and imaging results from the process of the present invention. The gray contour 111 represents the imaging results of the present invention, and the dark solid line contour 112 represents the imaging result of the prior art process. As shown, the dark solid line contour has numerous unwanted breaks throughout the resulting pattern.

Figure 12:
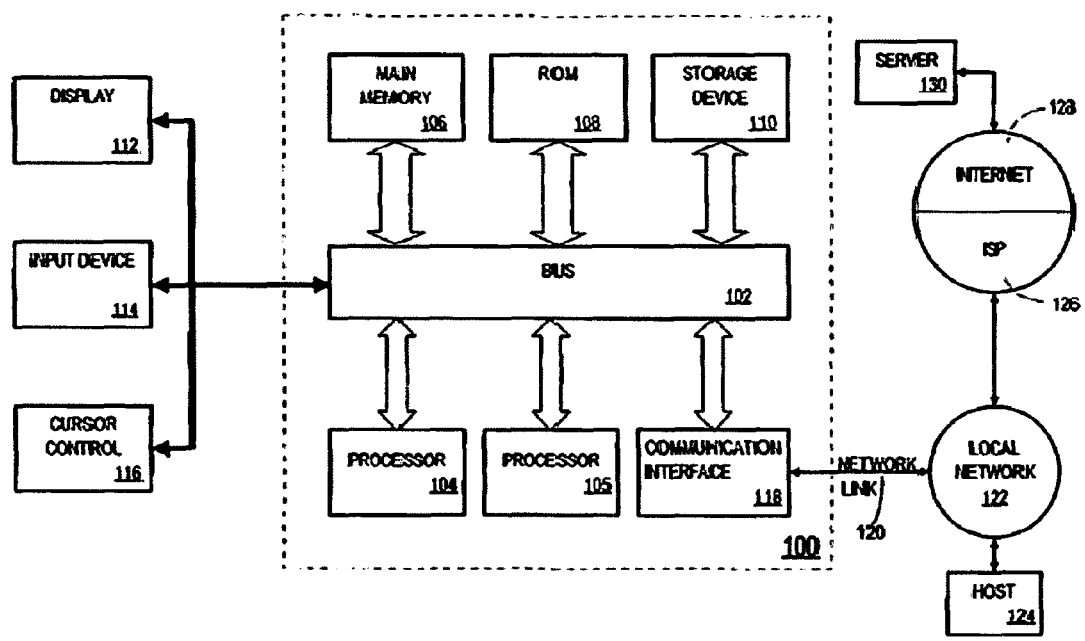
FIG. 12 is an exemplary block diagram illustrating a computer system which can implement a process of obtaining optimized short-range flare model parameters according to an embodiment of the present invention.

FIG. 12 is a block diagram that illustrates a computer system 100 which can assist in performing the process explained above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the disclosed process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the disclosed process of the embodiment, for example. The received code may be executed by processor 104 as it is received, and/or stored in storage device 110, or other non-volatile storage for later execution. In this manner, computer system 100 may obtain application code in the form of a carrier wave.

Figure 13:
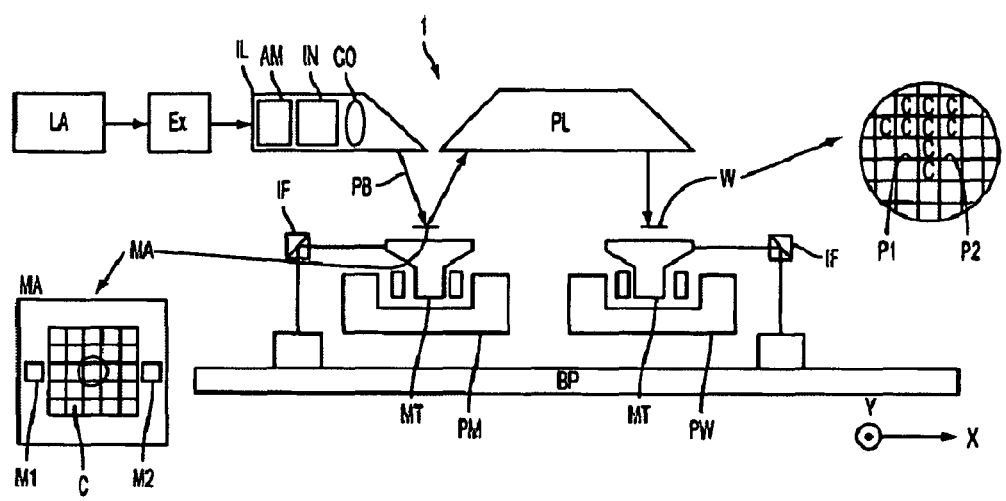
FIG. 13 schematically depicts an exemplary lithographic projection apparatus suitable for use with a mask designed with the aid of an embodiment of the present invention.

FIG. 13 schematically depicts a lithographic projection apparatus suitable for imaging the masks designed with the process of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 13 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 13. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of correcting a design layout to be imaged using a multiple-exposure optical lithography process, the method comprising:
    (a) separating a feature of the design layout into a first pattern and a second pattern, the first pattern to be imaged by a first exposure, and the second pattern to be imaged by a second exposure;
    (b) performing a first correction process on the first pattern, and a second correction process on the second pattern to extract overlap area between the first pattern and the second pattern;
    (c) adding the extracted overlap area to each of the first pattern and the second pattern; and
    (d) performing a third correction process on the first pattern including the extracted overlap area, and a fourth correction process on the second pattern including the extracted overlap area.

2. The method of claim 1, wherein the method further comprises:
    (e) combining the corrected first pattern and the corrected second pattern to create a corrected version of the original feature of the design layout; and
    (f) verifying that the corrected version of the original feature improves overall imaging performance of the multiple-exposure optical lithography process.

3. The method of claim 2, wherein steps (b) to (f) are repeated until the overall imaging performance of the multiple-exposure optical lithography process meets a desired quality.

4. The method of claim 2, wherein the method further comprises, after the verification step:
    (g) generating a first mask corresponding to the corrected first pattern, and a second mask corresponding to the corrected second pattern.

5. The method of claim 1, wherein one or more of the first correction process, the second correction process, the third correction process, and the fourth correction process are done using reference parameters for optical proximity correction (OPC).

6. The method of claim 1, wherein one or both of the first correction process and the second correction process are done using reference parameters for optical proximity correction (OPC), and, one or both of the third correction process and the fourth correction process are done using parameters dynamically adjusted with respect to the reference parameters for optical proximity correction (OPC).

7. The method of claim 1, wherein in step (a), the feature is separated based on line width or based on spacing between two lines in the feature.

8. The method of claim 1, wherein the overlap area is extracted in step (b) based on one or more of: Boolean operation and geometry of the feature.

9. The method of claim 1, wherein the third correction process and the fourth correction process are performed based on imaging errors estimated from the first correction process and the second correction process, respectively.

10. The method of claim 9, wherein the estimated imaging errors are converted into polygons that are added to the first pattern and the second pattern.

11. The method of claim 1, wherein prior to step (a), areas with relatively dense features are identified in the design layout.

12. The method of claim 1, wherein the design layout comprises a layout of an entire chip or a portion thereof.

13. The method of claim 1, wherein the steps are performed in a model-based simulation process.

14. A non-transitory computer-readable storage media storing a computer program having computer-executable instructions for causing a computer to use a model-based simulation process to correct a design layout to be imaged by multiple-exposure optical lithography process, the instructions causing the computer to perform the method of claim 1.

15. The computer program product of claim 14, wherein the instructions further causes the computer to perform the following steps:
   combining the corrected first pattern and the corrected second pattern to create a corrected version of the original feature of the design layout; and
   verifying that the corrected version of the original feature improves overall imaging performance of the multiple-exposure optical lithography process.

16. A computer-implemented system using a model-based simulation process to correct a design layout to be imaged using a multiple-exposure optical lithography process, the system comprising a computer processor performing the following steps:
   (a) separating a feature of the design layout into a first pattern and a second pattern, the first pattern to be imaged by a first exposure, and the second pattern to be imaged by a second exposure;
   (b) performing a first correction process on the first pattern, and a second correction process on the second pattern to extract overlap area between the first pattern and the second pattern;
   (c) adding the extracted overlap area to each of the first pattern and the second pattern; and
   (d) performing a third correction process on the first pattern including the extracted overlap area, and a fourth correction process on the second pattern including the extracted overlap area.

17. The system of claim 16, wherein the computer processor further performs:
   (e) combining the corrected first pattern and the corrected second pattern to create a corrected version of the original feature of the design layout; and
   (f) verifying that the corrected version of the original feature improves overall imaging performance of the multiple-exposure optical lithography process.

18. The system of claim 16, wherein one or more of the first correction process, the second correction process, the third correction process, and the fourth correction process are done using reference parameters for optical proximity correction (OPC).

19. The system of claim 16, wherein one or both of the first correction process and the second correction process are done using reference parameters for optical proximity correction (OPC), and, one or both of the third correction process and the fourth correction process are done using parameters dynamically adjusted with respect to the reference parameters for optical proximity correction (OPC).

20. The system of claim 16, wherein the overlap area is extracted in step (b) based on one or more of: Boolean operation and geometry of the feature.

21. The system of claim 16, wherein the third correction process and the fourth correction process are performed based on imaging errors estimated from the first correction process and the second correction process, respectively.

22. The system of claim 21, wherein the estimated imaging errors are converted into polygons that are added to the first pattern and the second pattern.

* * * * *